United States Patent
Wang et al.

(10) Patent No.: US 12,057,818 B2
(45) Date of Patent: Aug. 6, 2024

(54) VARIABLE CAPACITOR COMPRISED OF FIRST AND SECOND COMB STRUCTURES HAVING FIRST AND SECOND SETS OF SWITCHABLY CONNECTED FINGERS, A REFLECTION PHASE SHIFTER, AND A SEMICONDUCTOR DEVICE

(71) Applicant: Huawei Technologies Co., Ltd., Shenzhen (CN)

(72) Inventors: Shuo Wang, Shanghai (CN); Rong Peng, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 282 days.

(21) Appl. No.: 17/652,536

(22) Filed: Feb. 25, 2022

(65) Prior Publication Data
US 2022/0182015 A1    Jun. 9, 2022

Related U.S. Application Data

(63) Continuation of application No. PCT/CN2019/103882, filed on Aug. 30, 2019.

(51) Int. Cl.
  *H03H 7/20*   (2006.01)
  *H01P 1/15*   (2006.01)
  *H01P 1/18*   (2006.01)
  *H03C 7/02*   (2006.01)

(52) U.S. Cl.
  CPC .................. *H03H 7/20* (2013.01); *H01P 1/15* (2013.01); *H01P 1/18* (2013.01); *H03C 7/025* (2013.01); *H03C 2200/0008* (2013.01)

(58) Field of Classification Search
  CPC ..... H01P 1/18; H01P 1/10; H01P 1/15; H03H 7/20
  USPC .......................................................... 333/139
  See application file for complete search history.

(56) References Cited

U.S. PATENT DOCUMENTS

| 5,880,921 | A |   | 3/1999  | Than et al. |
| 6,133,807 | A | * | 10/2000 | Akiyama et al. ......... H01P 1/12 427/255.31 |
| 7,969,359 | B2 |  | 6/2011  | Krishnaswamy et al. |
| 9,577,600 | B2 |  | 2/2017  | Natarajan et al. |
| 10,062,946 | B2 |  | 8/2018  | Sharma et al. |

(Continued)

FOREIGN PATENT DOCUMENTS

| CN | 101030666 A | 9/2007 |
| CN | 101127513 A | 2/2008 |

(Continued)

*Primary Examiner* — Benny T Lee
(74) *Attorney, Agent, or Firm* — Slater Matsil, LLP

(57) ABSTRACT

This application discloses a variable capacitor, a reflection-type phase shifter, and a semiconductor device, which relate to the technical field of electronics, so as to resolve the problem that a capacitance value of a variable capacitor is sensitive to changes in PVT. The variable capacitor includes: a first comb structure and a first set of fingers, where the first comb structure includes a plurality of comb teeth, the first set of fingers includes at least one finger, and the finger in the first set of fingers is disposed between at least two comb teeth of the first comb structure, without electrical contact; a second comb structure and a second set of fingers, where the second comb structure includes a plurality of comb teeth.

18 Claims, 13 Drawing Sheets

(56) References Cited

U.S. PATENT DOCUMENTS

| | | |
|---|---|---|
| 10,269,490 B2 | 4/2019 | Wang et al. |
| 2005/0190018 A1 | 9/2005 | Kawai et al. |
| 2005/0270122 A1* | 12/2005 | Hyman et al. ............ H01P 1/18 333/164 |
| 2007/0200651 A1 | 8/2007 | Kawai et al. |
| 2010/0177457 A1 | 7/2010 | Willard |
| 2010/0231326 A1 | 9/2010 | Ziaei et al. |
| 2011/0102105 A1 | 5/2011 | Rogers |
| 2017/0310296 A1 | 10/2017 | Hahn et al. |

FOREIGN PATENT DOCUMENTS

| | | |
|---|---|---|
| CN | 101582527 A | 11/2009 |
| CN | 203300770 U | 11/2013 |
| JP | 2007235457 A | 9/2007 |

\* cited by examiner

VARIABLE CAPACITOR COMPRISED OF FIRST AND SECOND COMB STRUCTURES HAVING FIRST AND SECOND SETS OF SWITCHABLY CONNECTED FINGERS, A REFLECTION PHASE SHIFTER, AND A SEMICONDUCTOR DEVICE

CROSS-REFERENCE TO RELATED APPLICATIONS

This application is a continuation of International Application No. PCT/CN2019/103882, filed on Aug. 30, 2019, the disclosure of which is hereby incorporated by reference in its entirety.

TECHNICAL FIELD

This application relates to the technical field of electronics, and in particular, to a variable capacitor, a reflection-type phase shifter, and a semiconductor device.

BACKGROUND

A phased array technology is a core technology of a fifth-generation (5G) communications system. A phase shifter (PS) is a key module in the phased array technology. A reflection-type phase shifter (RTPS) is favored by many research institutions and industries due to its advantages such as a bidirectional phase shift characteristic, a simple structure, and extremely low power consumption. The RTPS includes a hybrid quadrature coupler and a variable reflective load, and phase shifting is implemented by changing an impedance of the variable reflective load. The impedance of the variable reflective load generally has three manners: series inductance and capacitance (LC), parallel LC, and r-type. Further, the impedance can be changed by changing a capacitance.

In the conventional technology, a variable reflective load may be implemented by a varactor. Because a capacitance value of the varactor is sensitive to changes in process, voltage, and temperature (PVT), the phase shifting has a very poor PVT consistency, which severely deteriorates phase shifting accuracy and resolution of a phase shifter.

SUMMARY OF THE INVENTION

Embodiments of this application provide a variable capacitor, a reflection-type phase shifter, and a semiconductor device, so as to resolve the problem that a capacitance value of a variable capacitor is sensitive to changes in PVT.

To achieve the foregoing objective, the following technical solutions are used in the embodiments of this application.

According to a first aspect, a variable capacitor is provided, including: a first comb structure and a first set of fingers, where the first comb structure includes a plurality of comb teeth, the first set of fingers includes at least one finger, the finger in the first set of fingers is disposed between at least two comb teeth of the first comb structure, and the finger in the first set of fingers has no electrical contact with the comb teeth of the first comb structure; a second comb structure and a second set of fingers, where the second comb structure includes a plurality of comb teeth, the second set of fingers includes at least one finger, the finger in the second set of fingers is disposed between at least two comb teeth of the first comb structure, and the finger in the second set of fingers has no electrical contact with the comb teeth of the second comb structure; and a switch configured to control whether there is electrical contact between the at least one finger in the first set of fingers and the at least one finger in the second set of fingers, where the first comb structure, the first set of fingers, the second comb structure, and the second set of fingers are all electrically conductive materials.

According to the variable capacitor and the reflection-type phase shifter provided in the embodiments of the application, a switch is used to control a quantity of capacitors in a capacitor array that are connected to the circuit, so as to control the capacitance value of the entire variable capacitor, which can achieve a very small capacitance step and a relatively large variable capacitance range. Moreover, because the foregoing variable capacitor uses an electrically conductive material (such as metal) in an array structure and the switch, the variable capacitor has relatively strong stability against changes in PVT, and helps, compared with a varactor, alleviate the problem that the capacitance value is sensitive to the changes in PVT.

In a possible implementation, the first comb structure and the second comb structure each include N+1 comb teeth, and the first set of fingers and the second set of fingers each include N fingers, where an $n^{th}$ finger in the first set of fingers is located between an $n^{th}$ comb tooth and an $(n+1)^{th}$ comb tooth of the first comb structure, and an $n^{th}$ finger in the second set of fingers is located between an $n^{th}$ comb tooth and an $(n+_1)^{th}$ comb tooth of the second comb structure, where n and N are both positive integers, and a value of n is less than or equal to a value of N.

In a possible implementation, N switches are connected between the first set of fingers and the second set of fingers, where a first terminal of an $n^{th}$ switch in the N switches is connected to the $n^{th}$ finger in the first set of fingers, and a second terminal of the $n^{th}$ switch in the N switches is connected to the $n^{th}$ finger in the second set of fingers.

In a possible implementation, a dielectric is sandwiched between the finger in the first set of fingers and the comb tooth of the first comb structure, and a dielectric is sandwiched between the finger in the second set of fingers and the comb tooth of the second comb structure. A dielectric being sandwiched between electrically conductive materials can increase a capacity of a capacitor.

In a possible implementation, the first set of fingers includes a plurality of sequentially arranged fingers, each of the first set of fingers having an equal length; and the second set of fingers includes a plurality of sequentially arranged fingers, each of the second set of fingers having an equal length.

In a possible implementation, the first set of fingers includes a plurality of sequentially arranged fingers, each of the first set of fingers having an increasing or decreasing length in the sequence of arrangement; and the second set of fingers includes a plurality of sequentially arranged fingers, each of the second set of fingers having an increasing or decreasing length in the sequence of arrangement.

In a possible implementation, a length ratio of adjacent fingers in the first set of fingers ranges from 1.02 times and 1.1 times, and a length ratio of adjacent fingers in the second set of fingers ranges from 1.02 times and 1.1 times. Although the capacitance value changes non-linearly, the phase shift curve of the reflection-type phase shifter is linear, and a relatively small phase shift step can be achieved regardless of the capacitance value.

In a possible implementation, the switch is a metal-oxide-semiconductor MOS switch. Alternatively, the switch may be a gallium nitride (GaN) switch.

In a possible implementation, the switch is controlled to be turned off or on by a set of digital switch codewords.

In a possible implementation, the first comb structure, the first set of fingers, the second comb structure, the second set of fingers, and the switch are located in a same metal layer. The process is simpler in this way than being located on different metal layers.

According to a second aspect, a reflection-type phase shifter is provided, including: a positive input port, a positive output port, a negative input port, a negative output port, a first hybrid quadrature coupler, a second hybrid quadrature coupler, a first inductor, a second inductor, a third inductor, a fourth inductor, a first variable capacitor, and a second variable capacitor, where the first variable capacitor and the second variable capacitor each are the variable capacitor described in any one of the first aspect and the implementations thereof. The positive input port is connected to an input port of the first hybrid quadrature coupler, the positive output port is connected to an isolated port of the first hybrid quadrature coupler, a coupled port of the first hybrid quadrature coupler is connected to a first connection terminal of the first variable capacitor via the first inductor, and a through port of the first hybrid quadrature coupler is connected to a first connection terminal of the second variable capacitor via the second inductor. The negative input port is connected to an input port of the second hybrid quadrature coupler, the negative output port is connected to an isolated port of the second hybrid quadrature coupler, a coupled port of the second hybrid quadrature coupler is connected to a second connection terminal of the first variable capacitor via the third inductor, and a through port of the second hybrid quadrature coupler is connected to a second connection terminal of the second variable capacitor via the fourth inductor.

In a possible implementation, the first hybrid quadrature coupler and the second hybrid quadrature coupler each are a parallel-coupled microstrip line directional coupler, the first inductor is arranged next to the third inductor, the second inductor is arranged next to the fourth inductor, and the first variable capacitor and the second variable capacitor are arranged between the first inductor and the second inductor and between the third inductor and the fourth inductor along routing directions of an input port and an output port of coupled lines of the first hybrid quadrature coupler and the second hybrid quadrature coupler.

According to a third aspect, a semiconductor device is provided, including the variable capacitor described in any one of the first aspect and the implementations thereof. For technical effects of the second aspect and the third aspect, refer to any one of the first aspect and the implementations thereof.

DETAILED DESCRIPTION OF ILLUSTRATIVE EMBODIMENTS

The following further describes technical solutions provided in this application with reference to the accompanying drawings and embodiments where like features have been denoted by the same reference label throughout the detailed description. It should be understood that a system structure and a service scenario provided in the embodiments of this application are mainly intended to explain some possible implementations of the technical solutions in this application, and should not be construed as a unique limitation on the technical solutions in this application. A person of ordinary skill in the art may know that, as a system evolves and an updated service scenario emerges, the technical solutions provided in this application are still applicable to a same or similar technical problem.

Figure 1A:
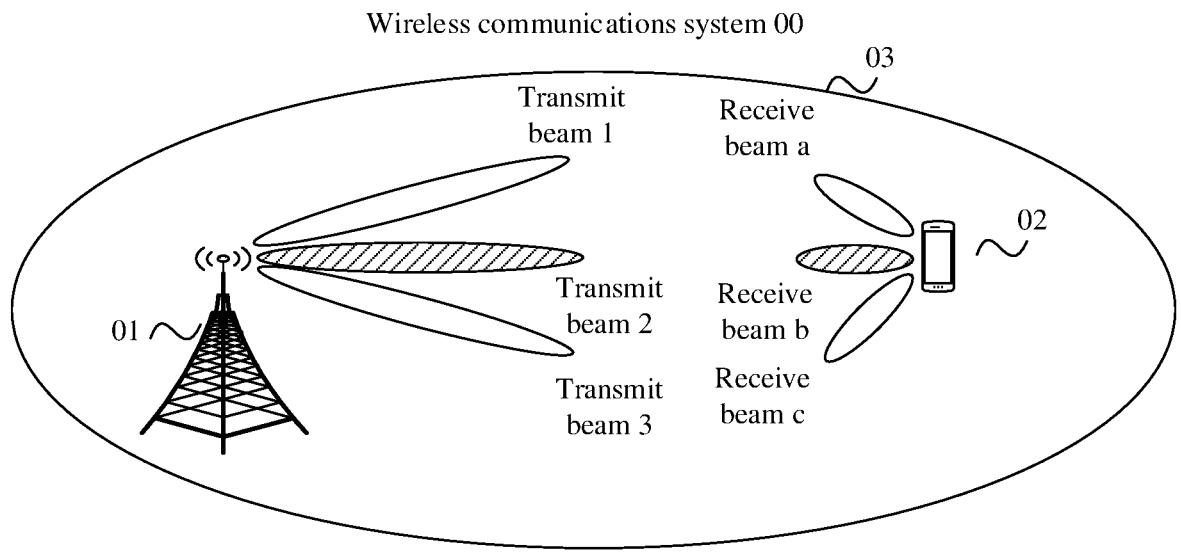
FIG. 1A depicts a structure of a wireless communications system according to an embodiment of this application.

FIG. 1A is a schematic diagram of a structure of a wireless communications system according to an embodiment of this application. FIG. 1A shows a wireless communications system 00 including a wireless network device 01 and a terminal 02. It should be understood that although FIG. 1A only shows one wireless network device and one terminal, the wireless communications system may alternatively include another quantity of wireless network devices and terminals, and may further include other network devices.

As shown in FIG. 1A, a transmit beam set of a base station includes a transmit beam 1, a transmit beam 2, and a transmit beam 3, and a receive beam set of a terminal includes a receive beam a, a receive beam b, and a receive beam c. The base station may sequentially transmit signals by using the transmit beam 1 to the transmit beam 3 within a specific time interval, to cover a terminal in a specific area. Correspondingly, the terminal may sequentially receive, by using the receive beam a to the receive beam c within a specific time interval, the transmitted signals carried by the different transmit beams.

The wireless communications system 00 may be used as an example of a mobile communications system according to the 3rd Generation Partnership Project (3GPP) technical specifications, and may also cover wireless communications systems according to other wireless communications standards, for example, the Institute of Electrical and Electronics Engineers (IEEE) 802 family, such as 802.11, 802.15, 802.20, and other wireless communications standards.

The wireless network device is a computing device having a wireless communication function, which can generate beams with different directions through beamforming and other technologies to cover a cell 03, and can communicate with terminals in different orientations within the cell 03. It should be understood that the wireless network device may be a wireless access network device such as a base station. It should be understood that the base station may also sometimes be referred to as a wireless access point ("AP") or a transmission reception point ("TRP"). The base station may be specifically a generation NodeB ("gNB") in a 5G mobile communications system, an evolved NodeB ("evolutional NodeB," "eNB" or "eNodeB") in a 4G mobile communications system, and a base station in other possible wireless access technologies. There may also be a plurality of physical forms and transmit powers of the base station, for example, a macro base station or a micro base station. The micro base station is also sometimes referred to as a small base station or a small cell.

The terminal may also be referred to as user equipment ("UE"), a mobile station ("MS"), or a subscriber unit ("SU"). The terminal may be specifically, but is not limited to, a mobile phone, a tablet computer, a laptop computer, a wearable device (a smartwatch, a smart band, a smart helmet, smart glasses, or the like), and other communications devices having a wireless access capability, such as various Internet of things devices, including various smart home devices (such as smart meters and smart home appliances), smart city devices (such as security or surveillance devices, smart road traffic facilities), and the like.

It can be understood that the wireless communications system structure in FIG. 1A is merely an example of an implementation in the embodiments of this application, and the communications system structure in the embodiments of this application includes but is not limited to the foregoing communications system structure.

It should be understood that these transmit beams and receive beams in FIG. 1A can be generated by a phased array of the base station and the terminal. A phased array is a phase-controlled electronically scanned array, and is formed by arranging a large quantity of antenna units into an array. Each antenna unit may be controlled by an independent switch, and a radiation direction of an electromagnetic wave is modulated by controlling an amplitude and a phase of the antenna unit in the array, to synthesize a directional scanning-focused beam.

Figure 1B:
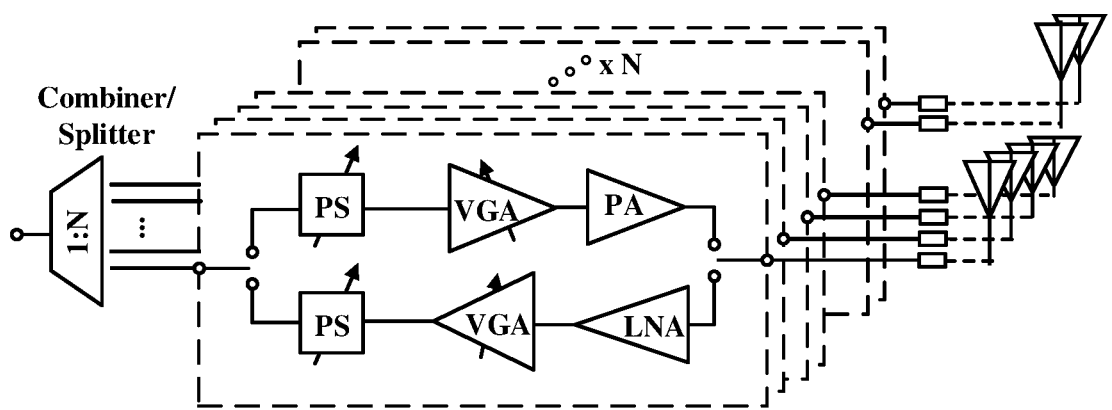
FIG. 1B depicts a partial structure of a phased array according to an embodiment of this application.

FIG. 1B is a schematic diagram of a partial structure of a phased array according to an embodiment of this application. As shown in FIG. 1B, the phased array includes an antenna array composed of a plurality of antennas. These antenna arrays can provide a plurality of transceiver channels for wireless communication, and a quantity of transceiver channels may be denoted as N. These transceiver channels (1:N in FIG. 1B) may use a combiner (combiner/splitter in FIG. 1B) to aggregate received signals, or may use a splitter (combiner/splitter in FIG. 1B) to split a to-be-sent signal. To control phases of the antenna units in the antenna array, the phased array naturally needs to include phase shifters for adjusting phase changes, and the phase shifters are denoted as PSs in FIG. 1B. In addition to the PSs, FIG. 1B further shows some amplifiers for amplifying signals, and the amplifiers include: a variable gain amplifier (VGA), a power amplifier (PA), and a low noise amplifier (LNA). It should be understood that FIG. 1B is merely for illustration, and the phased array in this embodiment of this application may further include other components.

Figure 1C:
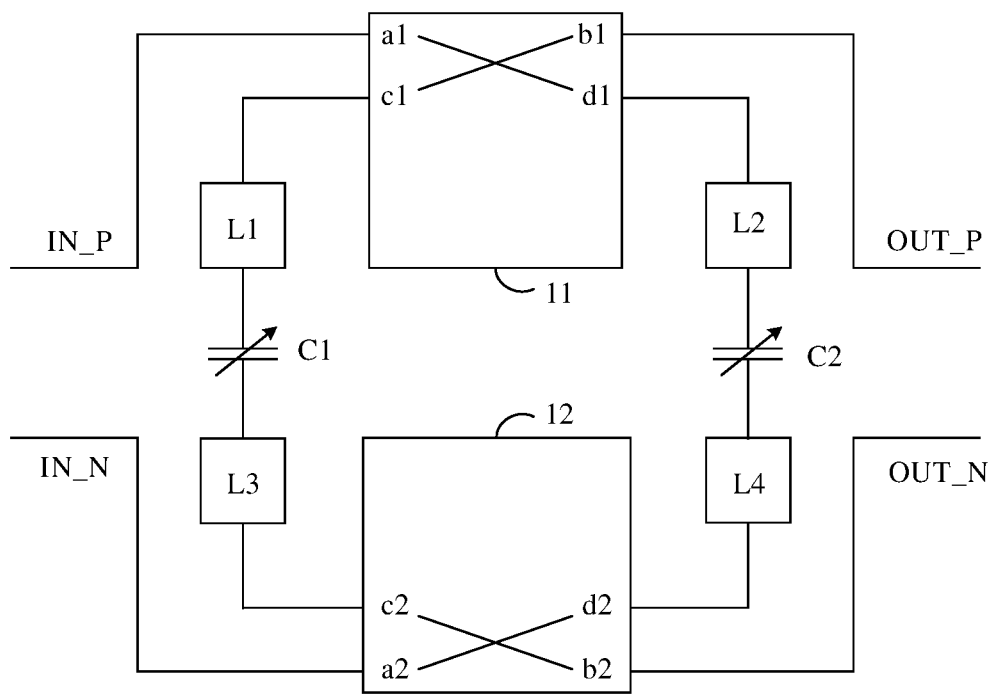
FIG. 1C depicts a structure of a reflection-type phase shifter according to an embodiment of this application.

FIG. 1C is a schematic diagram of a structure of a reflection-type phase shifter according to an embodiment of this application. The reflection-type phase shifter can be applied to the foregoing wireless communications system and phased array. As shown in FIG. 1C, the reflection-type phase shifter may include: a positive input port IN_P, a positive output port OUT_P, a negative input port IN_N, a negative output port OUT_N, a first hybrid quadrature coupler 11, a second hybrid quadrature coupler 12, a first inductor L1, a second inductor L2, a third inductor L3, a fourth inductor L4, a first variable capacitor C1, and a second variable capacitor C2.

The positive input port IN_P is connected to an input port a1 of the first hybrid quadrature coupler 11, the positive output port OUT_P is connected to an isolated port b1 of the first hybrid quadrature coupler 11, a coupled port c1 of the first hybrid quadrature coupler 11 is connected to a first connection terminal of the first variable capacitor C1 via the first inductor L1, and a through port d1 of the first hybrid quadrature coupler 11 is connected to a first connection terminal of the second variable capacitor C2 via the second inductor L2.

The negative input port IN_N is connected to an input port a2 of the second hybrid quadrature coupler 12, the negative output port OUT_N is connected to an isolated port b2 of the second hybrid quadrature coupler 12, a coupled port c2 of the second hybrid quadrature coupler 12 is connected to a second connection terminal of the first variable capacitor C1 via the third inductor L3, and a through port d2 of the first hybrid quadrature coupler 11 is connected to a second connection terminal of the second variable capacitor C2 via the fourth inductor L4.

The first variable capacitor C1 and the second variable capacitor C2 in the foregoing description each may be the following variable capacitor.

Figure 2:
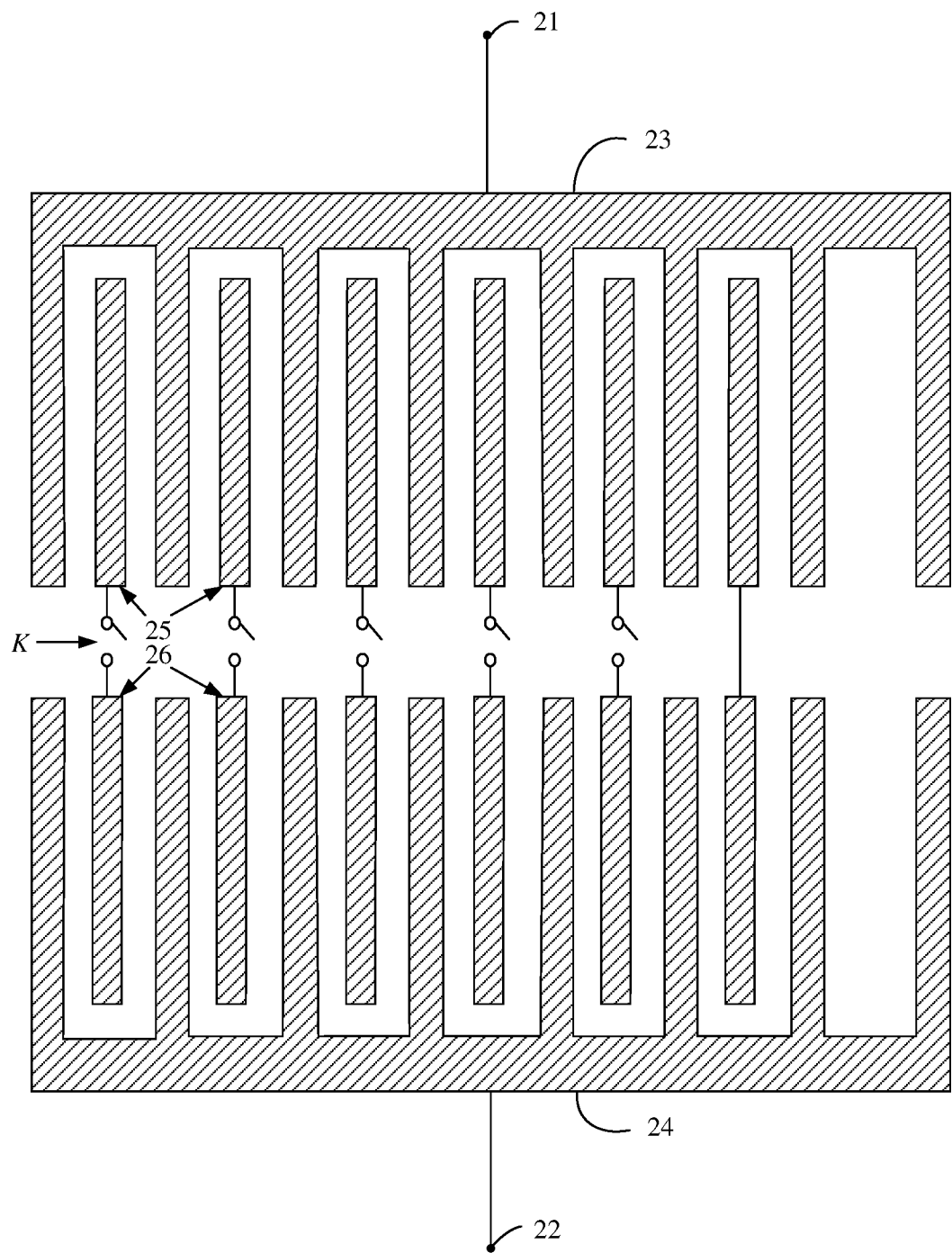
FIG. 2 depicts a structure of a variable capacitor according to an embodiment of this application.

As shown in FIG. 2, the variable capacitor includes: a first comb structure 23, a second comb structure 24, a first set of fingers 25, a second set of fingers 26, and at least one switch K. Optionally, the variable capacitor further includes a first connection terminal 21 and a second connection terminal 22. The first connection terminal 21 is connected to the first comb structure 23, and the second connection terminal 22 is connected to the second comb structure 24.

The first comb structure 23 includes a plurality of comb teeth, and the first set of fingers 25 includes at least one finger, where the finger in the first set of fingers 25 is disposed between at least two comb teeth of the first comb structure 23, and the finger in the first set of fingers 25 has no electrical contact with the comb teeth of the first comb structure 23. Further, the finger in the first set of fingers 25 is disposed between at least two adjacent comb teeth of the first comb structure 23.

The second comb structure 24 includes a plurality of comb teeth, and the second set of fingers 26 includes at least one finger, where the finger in the second set of fingers 26 is disposed between at least two comb teeth of the first comb structure 23, and the finger in the second set of fingers 26 has no electrical contact with the comb teeth of the second comb structure 24. Further, the finger in the second set of fingers 26 is disposed between at least two adjacent comb teeth of the first comb structure 23.

The at least one switch K is configured to control whether there is electrical contact between the at least one finger in the first set of fingers 25 and the at least one finger in the second set of fingers 26. When the at least one switch K is turned on, there is electrical contact between the at least one finger in the first set of fingers 26 and at least one finger in the second set of fingers 26; and when the at least one switch K is turned off, there is no electrical contact between the corresponding finger in the first set of fingers 26 and the corresponding finger in the second set of fingers 26. It should be noted that the at least one finger in the first set of fingers 25 and the at least one finger in the second set of fingers 26 may be in direct electrical contact, that is, whether the corresponding two fingers are connected is not controlled by using the switch.

The first comb structure 23, the first set of fingers 25, the second comb structure 24, and the second set of fingers 26 are all electrically conductive materials. Further, the first comb structure 23, the second comb structure 24, the first set of fingers 25, and the second set of fingers 26 are metal. For example, the metal may be copper, aluminum, gold, or the like.

The at least one switch K may be a metal-oxide-semiconductor (MOS) transistor switch or a gallium nitride (GaN) switch or the like, which is not limited in this application.

It should be noted that the electrical contact in this application may be understood as a state in which electrically conductive materials are in contact with each other to allow a current to pass. The comb structure in this application may be understood as an E-shaped electrically conductive material with one end connected together and the other end unconnected. The finger in the embodiments of this application may be understood as an electrically conductive material between two comb teeth of the comb structure. It should be understood that although the finger shown in FIG. 2 is strip-shaped, the finger in the embodiments of this application may not be limited to the strip shape shown in FIG. 2 as long as the finger and the two comb teeth of the comb structure constitute a capacitor required by the embodiments of this application.

In this embodiment of this application, a quantity of comb teeth included in the first comb structure 23 is greater than a quantity of fingers included in the first set of fingers 25. A quantity of comb teeth included in the second comb structure 24 is greater than a quantity of fingers included in the second set of fingers 26. The quantity of fingers included in the first set of fingers 25 or the quantity of fingers included in the second set of fingers 26 is greater than or equal to a quantity of switches in the at least one switch K. In other words, there may be no fingers between some adjacent comb teeth, and there may be no switches between some opposing fingers in the first set of fingers 25 and the second set of fingers 26. For example, the first comb structure 23 and the second comb structure 24 each include 10 comb teeth, the first set of fingers 25 and the second set of fingers 26 each include six fingers, and the at least one switch K includes four switches.

Figure 3:
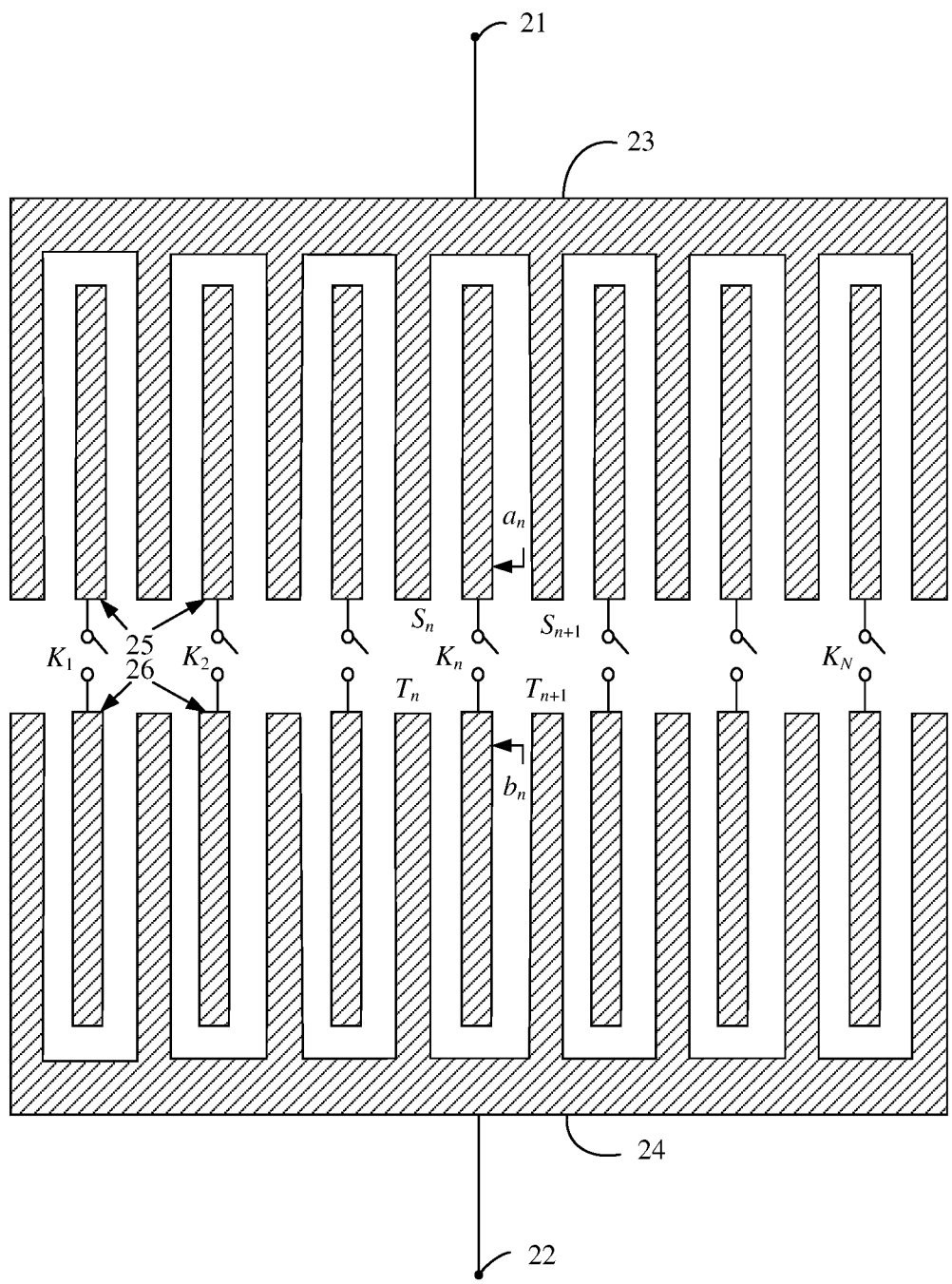
FIG. 3 depicts a structure of a variable capacitor according to an embodiment of this application.

In a possible implementation, as shown in FIG. 3, the first comb structure 23 is connected to first connection terminal 21, the second connection terminal 22 is connected to the second comb structure 24, the first comb structure 23 and the second comb structure 24 each include N+1 comb teeth, and the first set of fingers 25 and the second set of fingers 26 each include N fingers. The at least one switch K includes N switches $K_1$ to $K_N$, and the N switches $K_1$ to $K_N$ are connected between the first set of fingers 25 and the second set of fingers 26.

An $n^{th}$ finger $a_n$ in the first set of fingers 25 is located between an $n^{th}$ comb tooth $S_n$ and an $(n+1)^{th}$ comb tooth $S_{n+1}$ of the first comb structure 23, and the $n^{th}$ finger an in the first set of fingers 25 has no electrical contact with the $n^{th}$ comb tooth $S_n$ and an $(n+1)^{th}$ comb tooth $S_{n+1}$ of the first comb structure 23.

An $n^{th}$ finger $b_n$ in the second set of fingers 26 is located between an $n^{th}$ comb tooth $T_n$ and an $(n+1)^{th}$ comb tooth $T_{n+1}$ of the second comb structure 24, and the $n^{th}$ finger in the second set of fingers 26 has no electrical contact with the $n^{th}$ comb tooth $T_n$ and an $(n+1)^{th}$ comb tooth $T_{n+1}$ of the second comb structure 24.

A dielectric is sandwiched between the finger in the first set of fingers 25 and the comb tooth of the first comb structure 23, and a dielectric is sandwiched between the finger in the second set of fingers 26 and the comb tooth of the second comb structure 24. Specifically, a dielectric is sandwiched between the $n^{th}$ finger an in the first set of fingers 25 and each of the $n^{th}$ comb tooth S and the $(n+1)^{th}$ comb tooth $S_{n+1}$ of the first comb structure 23, and a dielectric is sandwiched between the $n^{th}$ finger $b_n$ in the second set of fingers 26 and each of the $n^{th}$ comb tooth $T_n$ and the $(n+1)^{th}$ comb tooth $T_{n+1}$ of the second comb structure 24.

A first terminal of an $n^{th}$ switch $K_n$ in the N switches is connected to one end of the $n^{th}$ finger $a_n$ in the first set of fingers 25, and a second terminal of the $n^{th}$ switch $K_n$ is connected to one end of the $n^{th}$ finger $b_n$ in the second set of fingers 26.

n and N are both positive integers, and a value of n is less than or equal to a value of N.

Figure 4:
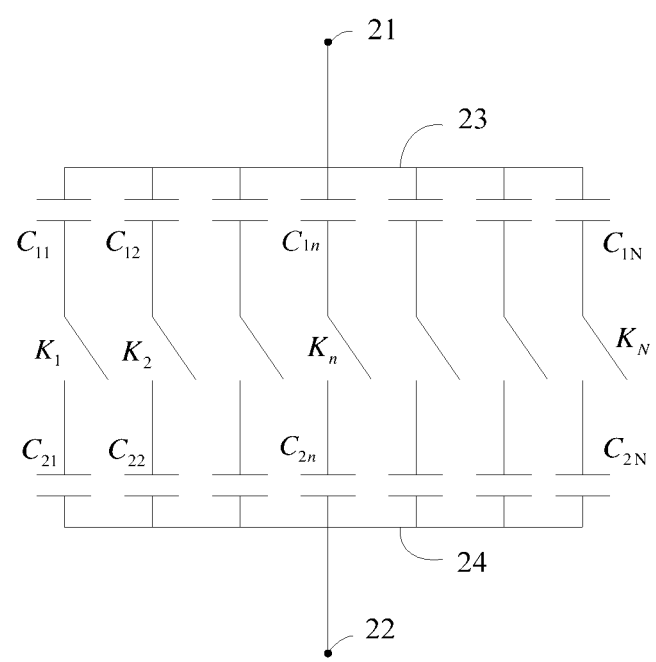
FIG. 4 depicts an equivalent circuit of a variable capacitor according to an embodiment of this application.

FIG. 4 shows an equivalent circuit of the foregoing variable capacitor. The first comb structure 23 is connected to first connection terminal 21. The second connection terminal 22 is connected to the second comb structure 24. The $n^{th}$ finger $a_n$ in the first set of fingers 25 (shown in FIGS. 2-3) and the $n^{th}$ comb tooth $S_n$ and the $(n+1)^{th}$ comb tooth $S_{n+1}$ of the first comb structure 23 form a capacitor $C_{1n}$, and the $n^{th}$ finger $b_n$ in the second set of fingers 26 (shown in FIGS. 2-3) and the $n^{th}$ comb tooth $T_n$ and the $(n+1)^{th}$ comb tooth $T_{n+1}$ of the second comb structure 24 form a capacitor $C_{2n}$.

When the $n^{th}$ switch $K_n$ is turned on, the capacitor $C_{1n}$ and the capacitor $C_{2n}$ are connected in series, and a capacitance value of a capacitor $C_n$ (not separately shown in FIG. 4) corresponding to the turned-on switch $K_n$ is $(C_{1n}*C_{2n})/(C_{1n}+C_{2n})$. In particular, when the capacitor $C_{1n}$ is equal to the capacitor $C_{2n}$, a capacitance value of the capacitor $C_n$ corresponding to the switch $K_n$ is $C_{1n}/2$ or $C_{2n}/2$. Therefore, the introduction of the switch $K_n$ in the capacitor structure can cause the smallest change value of the capacitor to be $(C_{1n}*C_{2n})/(C_{1n}+C_{2n})$, which is less than the capacitance $C_{1n}$ or the capacitance $C_{2n}$, so that capacitance adjustment precision of the variable capacitor can be reduced.

When more than one switch is turned on, capacitors corresponding to the turned-on switches are connected in parallel, and a capacitance of the entire variable capacitor is a sum of the capacitors connected in parallel. Turning on a different quantity of switches can change the capacitance value of the variable capacitor. For example, a capacitor corresponding to a switch $K_1$ is $C_1$ (not separately shown in FIG. 4), and a capacitor corresponding to a switch $K_n$ is $C_n$. If the switches $K_1$ and $K_n$ are turned on, the capacitance value of the entire variable capacitor is $C_1+C_n$.

According to the variable capacitor and the reflection-type phase shifter provided in the embodiments of the application, a switch is used to control a quantity of capacitors in a capacitor array that are connected to the circuit, so as to control the capacitance value of the entire variable capacitor, which can achieve a very small capacitance step and a relatively large variable capacitance range. The capacitance step thereof can be 2 fF to 3 fF, and a variable capacitance ratio can reach 3.4. Moreover, because the foregoing variable capacitor uses an electrically conductive material (such as metal) in an array structure, the variable capacitor has relatively strong stability against changes in PVT, resolving the problem that the capacitance value is sensitive to the changes in PVT.

It should be noted that as shown in FIG. 4, all the fingers in the first set of fingers 25 have an equal length, and all the fingers in the second set of fingers 26 have an equal length. To be specific, the first set of fingers 25 includes a plurality of sequentially arranged fingers, each of the first set of fingers 25 having an equal length; and the second set of fingers 26 includes a plurality of sequentially arranged fingers, each of the second set of fingers 26 having an equal length. However, this application does not limit the lengths of the fingers in the first set of fingers 25 or the second set of fingers 26. For example, the fingers in the first set of fingers 25 or the second set of fingers 26 may be of equal length or unequal length, or may be of alternately changing length, or may be of increasing or decreasing length as described below: The first set of fingers 25 includes a plurality of sequentially arranged fingers, each of the first set of fingers 25 having an increasing or decreasing length in the sequence of arrangement; and the second set of fingers 26 includes a plurality of sequentially arranged fingers, each of the second set of fingers 26 having an increasing or decreasing length in the sequence of arrangement.

Figure 5:
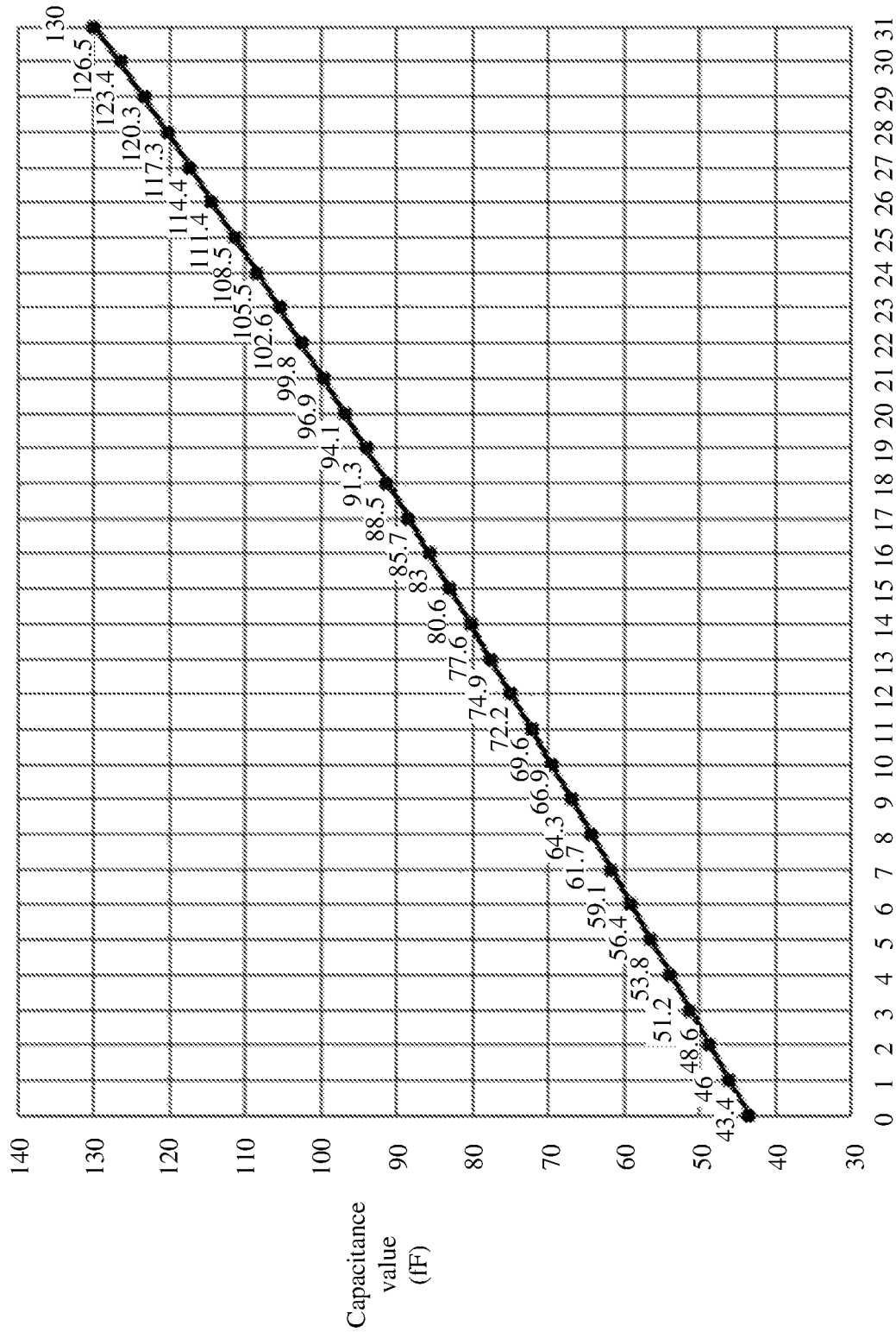
FIG. 5 depicts a curve of a capacitance value of a variable capacitor versus a switch codeword of a switch according to an embodiment of this application.

The switch K is controlled to be turned off or on by a set of digital switch codewords. Accordingly, the capacitance value of the variable capacitor changes with the switch codeword of the switch K. FIG. 5 shows a curve of a capacitance value of a variable capacitor (in femtofarad (fF)) versus switch codewords of switches $K_1$ to $K_N$ (the maximum depicted value of the switch codeword is 31 in FIG. 5). The switch codewords are corresponding binary representations of the switches $K_1$ to $K_N$. For example, one bit corresponds to an on/off state of one switch. The bit being 0 indicates that the switch is turned off, and the bit being 1 indicates that the switch is turned on. When switches $K_1$ to $K_N$ are represented by bits in order from low to high, 0010 may indicate that the switches $K_1$, $K_3$, and $K_4$ are turned off, and the switch $K_2$ is turned on.

It can be seen from the curve in FIG. 5 that the capacitance value of the variable capacitor changes linearly.

Figure 6:
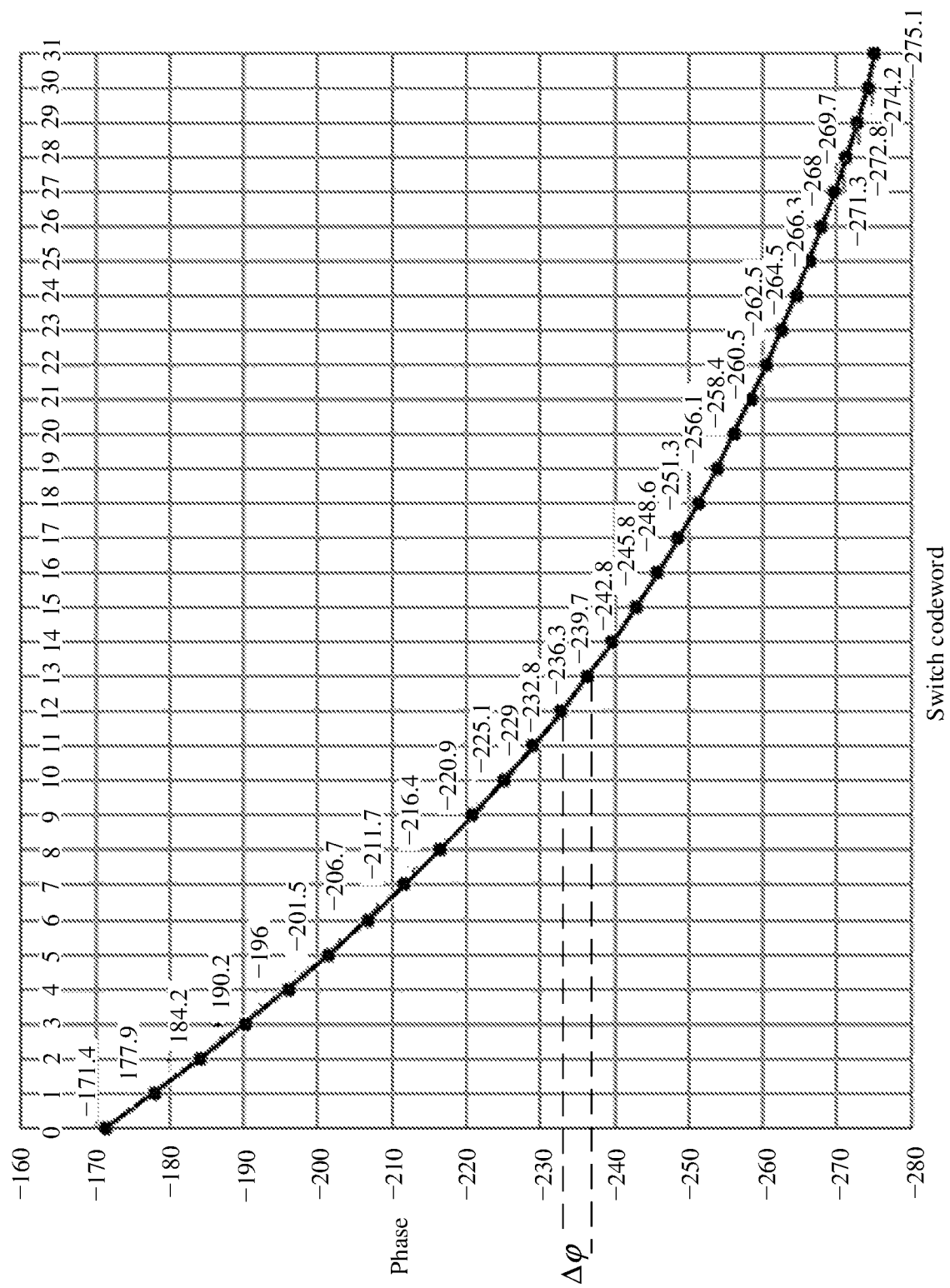
FIG. 6 depicts a phase shift curve of a reflection-type phase shifter according to an embodiment of this application.

Phase shift characteristics of the reflection-type phase shifter are shown in Formula 1 as follows:

$$\Delta\varphi = -2\left[\arctan\left(\frac{WL - 1/(WC_n)}{Z_0}\right) - \arctan\left(\frac{WL - 1/(WC_0)}{Z_0}\right)\right] \quad \text{Formula 1}$$

where $\Delta\varphi$ is a phase shift amount, W is a frequency, L is an inductance value of an inductor connected in series with the variable capacitor, $Z_0$ is a characteristic impedance, and $C_n$ is a capacitance value of the variable capacitor when the $n^{th}$ switch $K_n$ is turned on.

$$\arctan\left(\frac{WL - 1/(WC_0)}{Z_0}\right)$$

in the above formula is an initial phase shift when all the switches of the variable capacitor are turned off, and is a constant. The phase shift $\Delta\varphi$ of the reflection-type phase shifter is essentially an arctangent function of $1/C_n$. When the capacitance value of the variable capacitor changes linearly as shown in FIG. 5, a corresponding phase shift curve of the reflection-type phase shifter is shown in FIG. 6, which depicts a curve of a phase versus switch codewords of switches $K_1$ to $K_N$ (the maximum depicted value of the switch codeword is 31 in FIG. 6). It can be seen from the curve that the phase shift $\Delta\varphi$ of the reflection-type phase shifter is non-linear, which means that a phase shift step is also non-linear. In addition, the phase shift step decreases with an increase of n in the switch codeword, and the phase shift step is maximum when n is extremely small, which is very disadvantageous to the implementation of a high resolution reflection-type phase shifter.

To resolve this problem, the capacitance value $C_n$ when the $n^{th}$ switch is turned on can be set properly, to fit Formula 1 into an approximate tangent function, so that a linear phase shift curve and a relatively small phase shift step can be obtained by properly controlling the capacitance step.

Optionally, when the $n^{th}$ switch $K_n$ is turned on, a total capacitance value (that is, a sum of the capacitance formed by the $n^{th}$ finger $a_n$ in the first set of fingers 25 and the $n^{th}$ comb tooth $S_n$ and the $(n+1)^{th}$ comb tooth $S_{n+1}$ of the first comb structure 23, and the capacitance formed by the $n^{th}$ finger in the second set of fingers 26 and the $n^{th}$ comb tooth $T_n$ and the $(n+1)^{th}$ comb tooth $T_{n+1}$ of the second comb structure 24) of the variable capacitor is the following value:

$$C_n = \frac{1}{W^2L - WZ_0\tan\left(\arctan\frac{WL - 1/(WC_0)}{Z_0} - \frac{\Delta\varphi}{2}\right)},$$

where $\Delta\varphi$ is a phase shift amount, W is a frequency, L is an inductance value of an inductor connected in series with the variable capacitor, and is a characteristic impedance.

Figure 7:
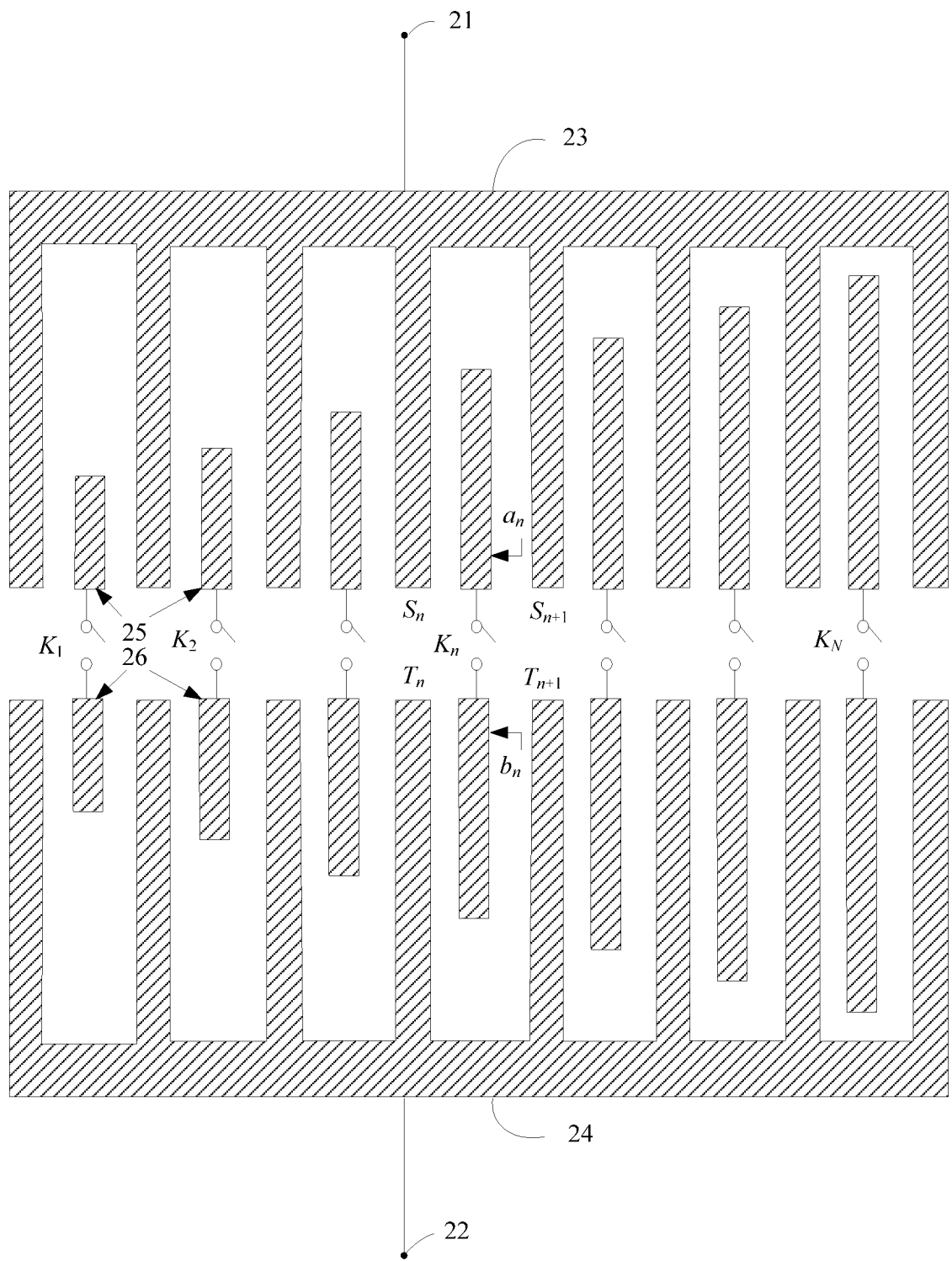
FIG. 7 depicts a structure of a variable capacitor according to an embodiment of this application.
Figure 8:
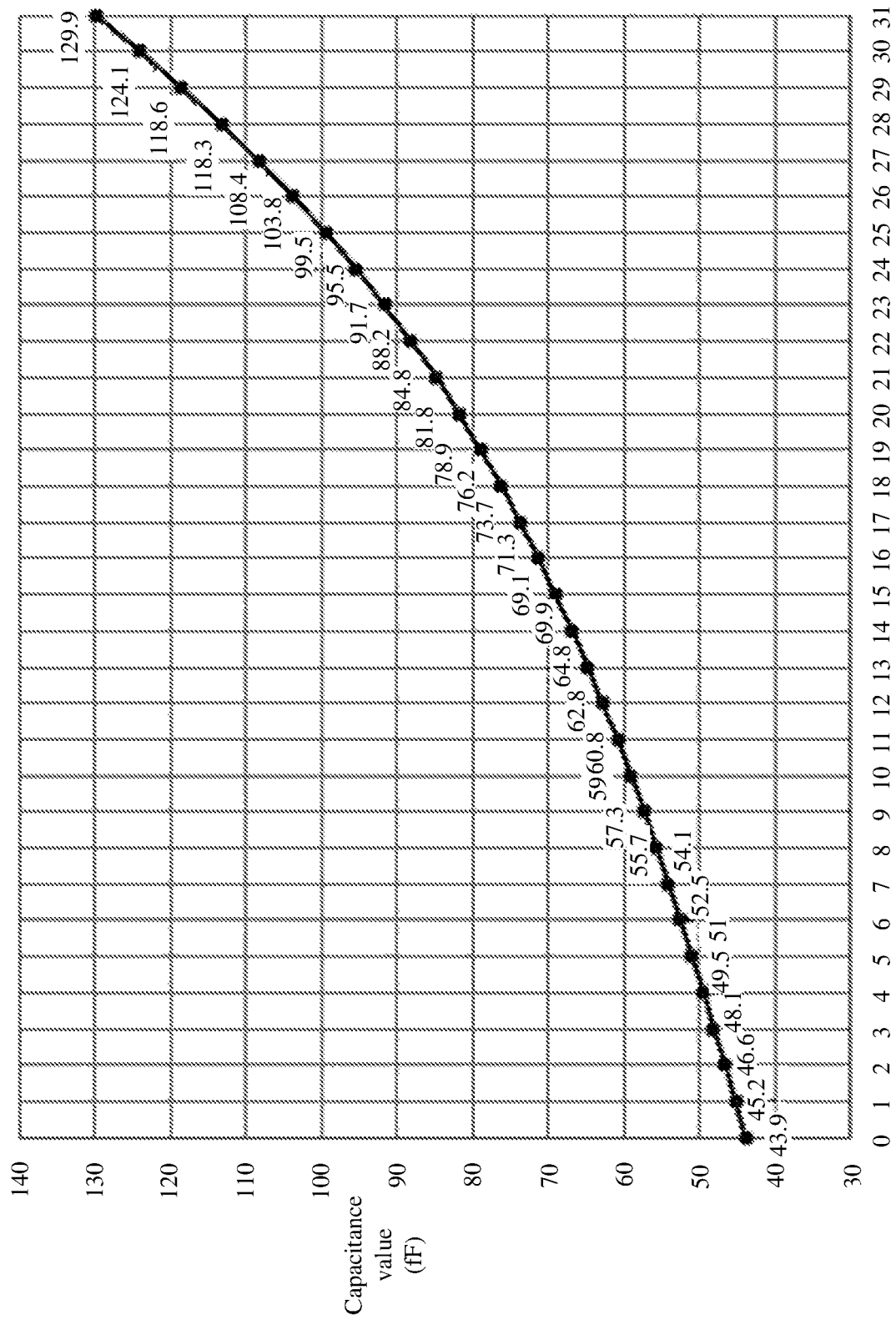
FIG. 8 depicts a curve of a capacitance value of a variable capacitor versus a switch codeword of a switch according to an embodiment of this application.
Figure 9:
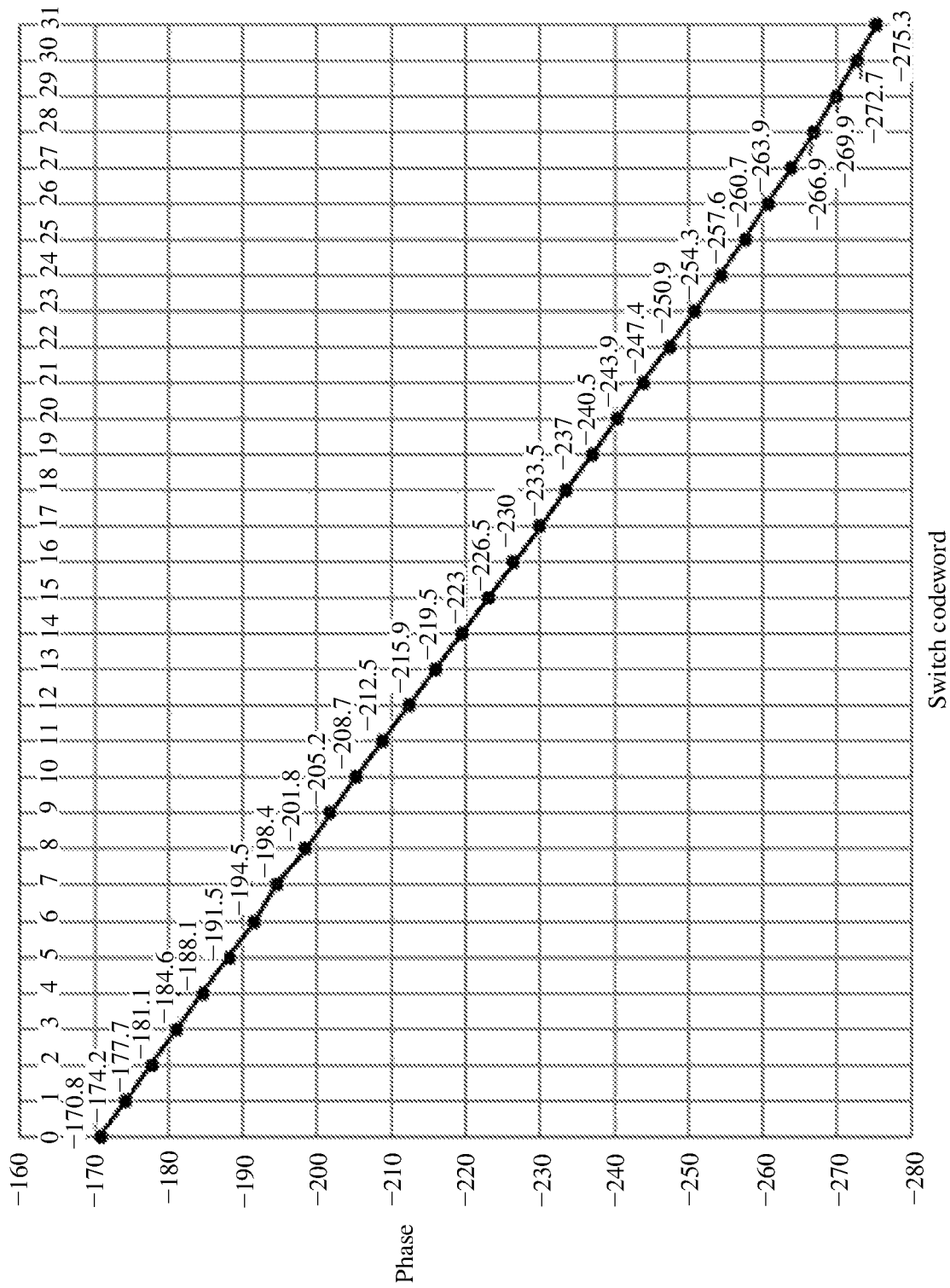
FIG. 9 depicts a phase shift curve of a reflection-type phase shifter according to an embodiment of this application.

According to the above formula, a length ratio of adjacent fingers (for example, the finger $a_{n+1}$ and the finger $a_n$) in the first set of fingers 25 ranges from 1.02 times and 1.1 times, and a length ratio of adjacent fingers (for example, the finger $b_{n+1}$ and the finger $b_n$) in the second set of fingers 26 ranges from 1.02 times and 1.1 times. A structure of an optimized variable capacitor is shown in FIG. 7. In FIG. 7 like features have been denoted using the same reference numbers as used in FIGS. 2-4. A curve of a capacitance value of the optimized variable capacitor (in femtofarad (fF)) versus switch codewords of switches $K_1$ to $K_N$ is shown in FIG. 8. A phase shift curve of a corresponding reflection-type phase shifter is shown in FIG. 9.

It can be seen from the curves that although the capacitance value changes non-linearly, the phase shift curve of the reflection-type phase shifter is linear, and a relatively small phase shift step can be achieved regardless of the capacitance value.

A comb structure and a finger may be etched in a same metal layer, that is, the first comb structure 23, the first set of fingers 25, the second comb structure 24, the second set of fingers 26, and the switch K are located in the same metal layer. Alternatively, the first comb structure 23 and the first set of fingers 25 are located in a first metal layer, the second comb structure 24 and the second set of fingers 26 are located in a second metal layer, and the switch K may be located in the first metal layer or the second metal layer, where the switch K and the finger in the other metal layer may be in communication through a through hole.

Figure 10:
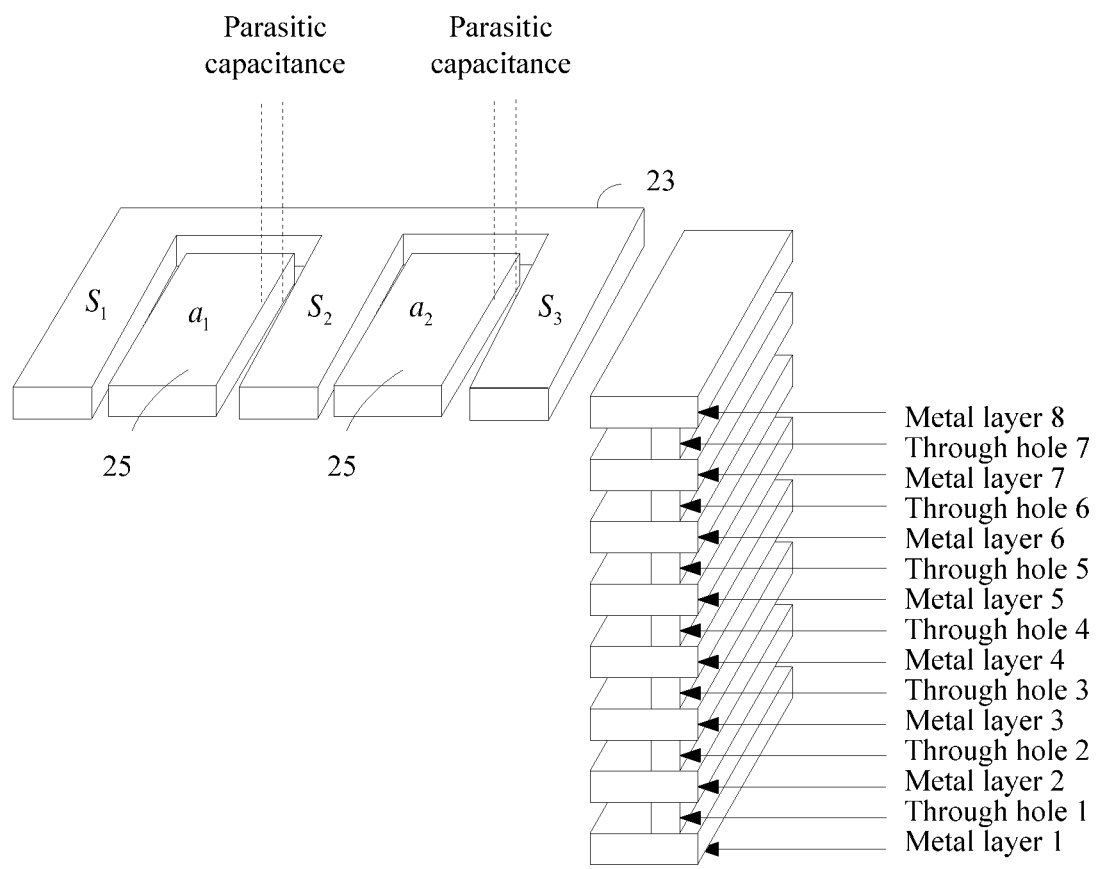
FIG. 10 depicts a processing structure of a variable capacitor according to an embodiment of this application.

For example, FIG. 10 shows a processing structure of a variable capacitor. A structure includes metal layer 1, through hole 1, metal layer 2, through hole 2, metal layer 3, through hole 3, metal layer 4, through hole 4, metal layer 5, through hole 5, metal layer 6, through hole 6, metal layer 7, through hole 7, and metal layer 8. A comb structure and a finger may be etched in a metal layer 8. The figure shows only a first comb tooth $S_1$, a second comb tooth $S_2$, and a third comb tooth $S_3$ of the first comb structure 23, and a finger $a_1$ and a finger $a_2$ in the first set of fingers 25. Adjacent comb teeth and a finger form a capacitor, depicted as parasitic capacitance between finger $a_1$ and second comb tooth $S_2$, and parasitic capacitance between finger $a_2$ and third comb tooth $S_3$. It should be noted that this application is not limited to only the use of the above processing structure.

Figure 11:
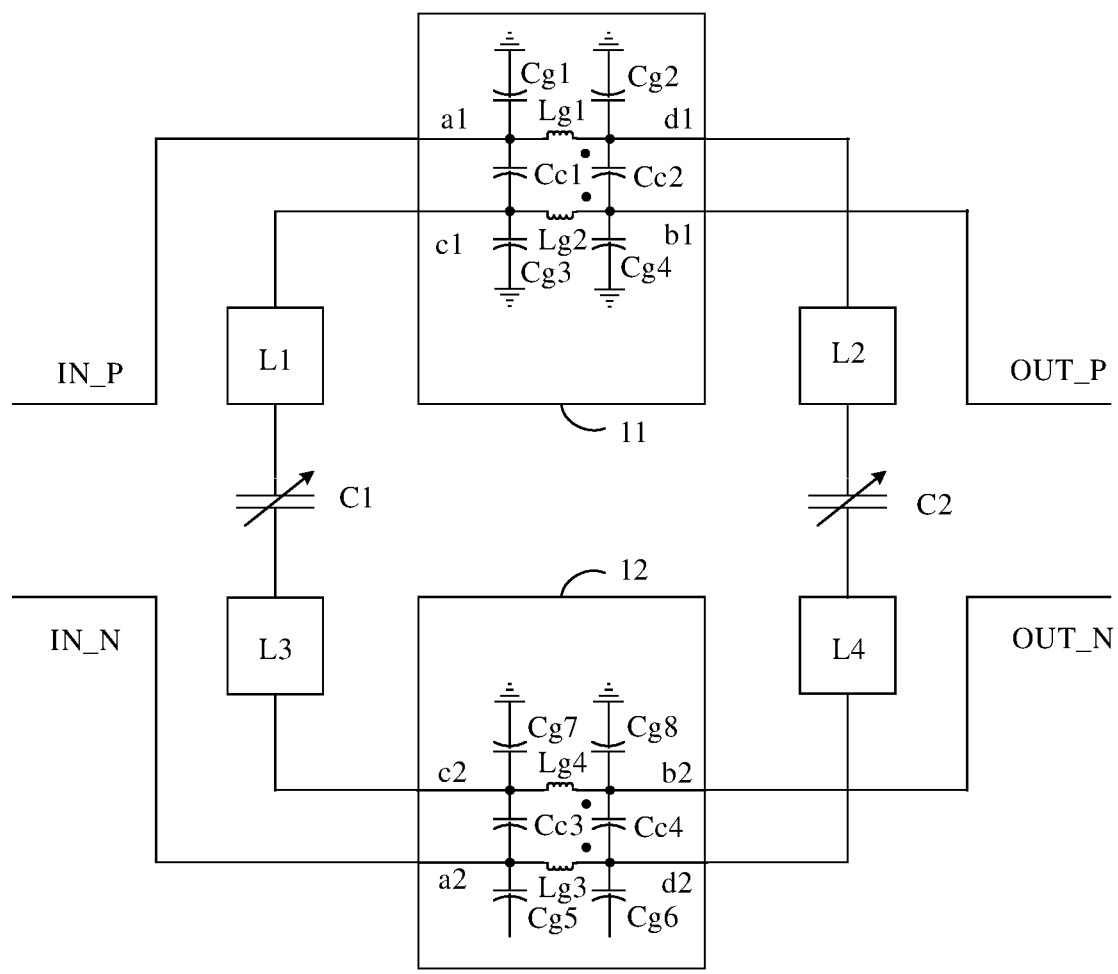
FIG. 11 depicts a structure of a reflection-type phase shifter according to an embodiment of this application.

As shown in FIG. 11, when the first hybrid quadrature coupler 11 and the second quadrature coupler 12 are centralized LC couplers. In FIG. 11 like features have been denoted using the same reference numbers as used in FIGS. 1-10, including positive input port IN_P, positive output port OUT_P, negative input port IN_N, negative output port OUT_N, first inductor L1, second inductor L2, third inductor L3, fourth inductor L4, a first variable capacitor C1, second variable capacitor C2, and connections a1, b1, c1, d1, a2, c2, b2, and d2.

The first hybrid quadrature coupler 11 includes a capacitor Cc1, a capacitor Cc2, a capacitor Cg1, a capacitor Cg2, a capacitor Cg3, a capacitor Cg4, an inductor Lg1, and an inductor Lg2. An input port a1 of the first hybrid quadrature coupler 11 is connected to a first terminal of the capacitor Cc1, a first terminal of the capacitor Cg1, and a first terminal of the inductor Lg1. An input port c1 of the first hybrid quadrature coupler 11 is connected to a second terminal of the capacitor Cc1, a first terminal of the capacitor Cg3, and a first terminal of the inductor Lg2. A through port d1 of the first hybrid quadrature coupler 11 is connected to a first terminal of the capacitor Cc2, a first terminal of the capacitor Cg2, and a second terminal of the inductor Lg1. An output port b1 of the first hybrid quadrature coupler 11 is connected to a second terminal of the capacitor Cc2, a first terminal of the capacitor Cg4, and a second terminal of the inductor Lg2. A second terminal of the capacitor Cg1, a second terminal of the capacitor Cg2, a second terminal of the capacitor Cg3, and a second terminal of the capacitor Cg4 are grounded.

The second hybrid quadrature coupler 12 includes a capacitor Cc3, a capacitor Cc4, a capacitor Cg5, a capacitor Cg6, a capacitor Cg7, a capacitor Cg8, an inductor Lg3, and an inductor Lg4. An input port a2 of the second hybrid quadrature coupler 12 is connected to a first terminal of the capacitor Cc3, a first terminal of the capacitor Cg5, and a first terminal of the inductor Lg3. An input port c2 of the second hybrid quadrature coupler 12 is connected to a second terminal of the capacitor Cc3, a first terminal of the capacitor Cg7, and a first terminal of the inductor Lg4. A through port d2 of the second hybrid quadrature coupler 12 is connected to a first terminal of the capacitor Cc4, a first terminal of the capacitor Cg6, and a second terminal of the inductor Lg3. An output port b2 of the second hybrid quadrature coupler 12 is connected to a second terminal of the capacitor Cc4, a first terminal of the capacitor Cg8, and a second terminal of the inductor Lg4. A second terminal of the capacitor Cg5, a second terminal of the capacitor Cg6, a second terminal of the capacitor Cg7, and a second terminal of the capacitor Cg8 are grounded.

Figure 12:
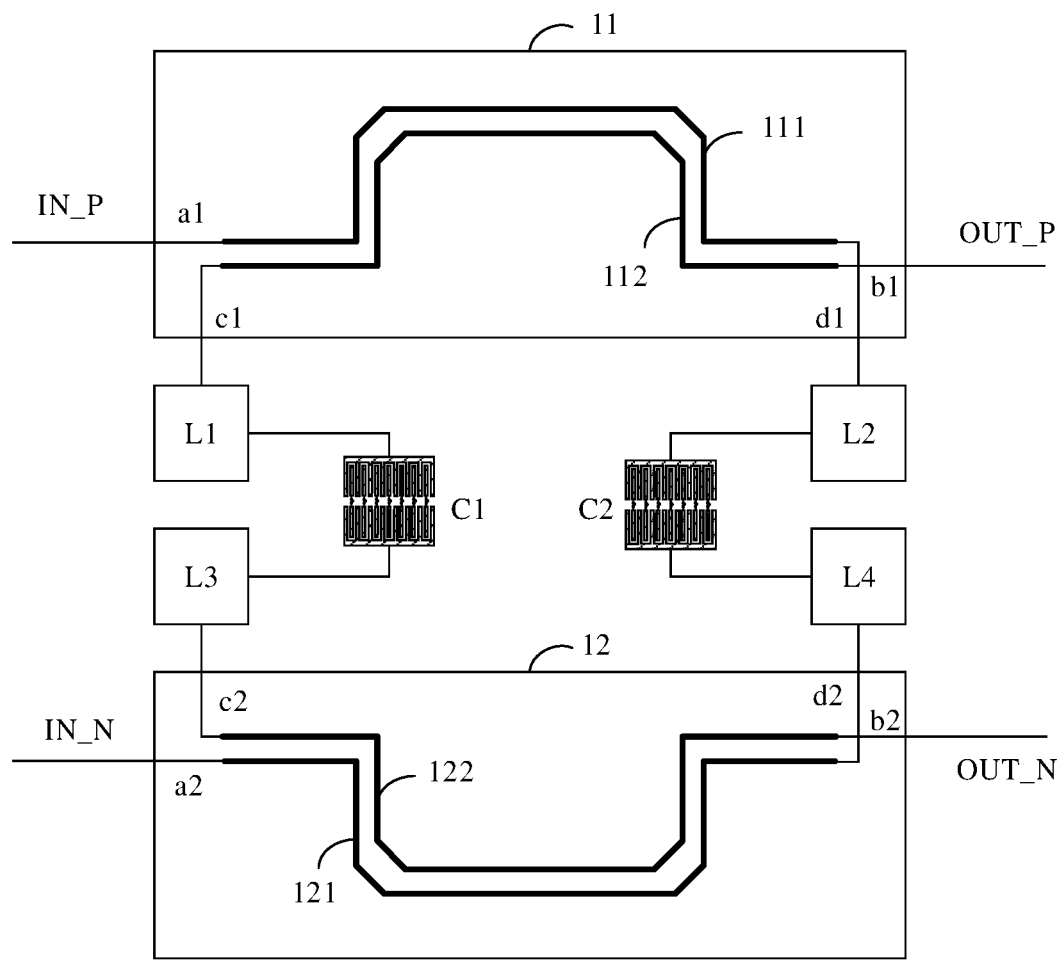
FIG. 12 depicts a structure of a reflection-type phase shifter according to an embodiment of this application.

As shown in FIG. 12, when the first hybrid quadrature coupler 11 and the second hybrid quadrature coupler 12 are parallel-coupled microstrip line directional couplers, the first hybrid quadrature coupler 11 includes a first coupled microstrip line 11 and a second coupled microstrip line 112; and the second hybrid quadrature coupler 12 includes a third coupled microstrip line 121 and a fourth coupled microstrip line 122. A first end a1 of the first coupled microstrip line 11 is connected to the positive input port IN_P, and a second end d1 of the first coupled microstrip line 11 is connected to a first terminal of the second inductor L2. A first end c1 of the second coupled microstrip line 112 is connected to a first terminal of the first inductor L1, and a second end b1 of the second coupled microstrip line 112 is connected to the positive output port OUT_P. A first end a2 of the third coupled microstrip line 121 is connected to the negative input port IN_N, and a second end d2 of the third coupled microstrip line 121 is connected to a first terminal of the fourth inductor L4 respectively. A first terminal c2 of the fourth coupled microstrip line 122 is connected to a first terminal of the third inductor L3, and a second end b2 of the fourth coupled microstrip line 122 is connected to the negative output port OUT_N.

The first inductor L1 is arranged next to the third inductance L3, the second inductor L2 is arranged next to the fourth inductance L4, and the first variable capacitor C1 and the second variable capacitor C2 are arranged between the first inductor L1 and the second inductor L2 and between the third inductance L3 and the fourth inductance L4 along routing directions of an input port and an output port of coupled lines of the first hybrid quadrature coupler 11 and the second hybrid quadrature coupler 12.

Compared with the layout of the reflection-type phase shifter shown in FIG. 11, the layout of the reflection-type phase shifter shown in FIG. 12 uses the space between the two couplers to arrange the variable capacitors, which can effectively reduce an area of the overall layout of the reflection-type phase shifter. In FIG. 12 like features have been denoted using the same reference numbers as used in FIGS. 1-10, including positive input port IN_P, positive output port OUT_P, negative input port IN_N, negative output port OUT_N, first inductor L1, second inductor L2, third inductor L3, fourth inductor L4, a first variable capacitor C1, second variable capacitor C2, and connections a1, b1, c1, d1, a2, c2, b2, and d2.

An embodiment of this application further provides a semiconductor device, which may include the variable capacitor described above. For beneficial effects that can be achieved, refer to the beneficial effects in the embodiment provided above, and details are not described herein again. The semiconductor device may be a complete device such as a mobile phone or a base station, or may be an integrated circuit product in the complete device, such as a chip applied to radio frequency communication.

The foregoing description is merely a specific implementation of this application, but is not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:
1. A variable capacitor, comprising:
 a first comb structure and a first set of fingers, wherein the first comb structure comprises a first plurality of comb teeth, the first set of fingers comprises at least one first finger, the at least one first finger in the first set of fingers is disposed between at least two comb teeth of the first comb structure, and the at least one first finger in the first set of fingers has no electrical contact with the first plurality of comb teeth of the first comb structure;

a second comb structure and a second set of fingers, wherein the second comb structure comprises a second plurality of comb teeth, the second set of fingers comprises at least one second finger, the at least one second finger in the second set of fingers is disposed between at least two comb teeth of the second comb structure, and the at least one second finger in the second set of fingers has no electrical contact with the second plurality of comb teeth of the second comb structure; and a switch, configured to control whether there is electrical contact between the at least one first finger in the first set of fingers and the at least one second finger in the second set of fingers, wherein the first comb structure, the first set of fingers, the second comb structure, and the second set of fingers all comprise electrically conductive materials.

2. The variable capacitor according to claim 1, wherein:
the first comb structure and the second comb structure each comprise N+1 comb teeth, and the first set of fingers and the second set of fingers each comprise N fingers; and
for each integer value of n from 1 to N, an $n^{th}$ finger in the first set of fingers is located between an $n^{th}$ comb tooth and an $(n+1)^{th}$ comb tooth of the first comb structure, and an $n^{th}$ finger in the second set of fingers is located between an $n^{th}$ comb tooth and an $(n+1)^{th}$ comb tooth of the second comb structure, wherein n and N are both positive integers.

3. The variable capacitor according to claim 2, wherein N switches are connected between the first set of fingers and the second set of fingers, wherein a first terminal of an $n^{th}$ switch in the N switches is connected to the $n^{th}$ finger in the first set of fingers, and a second terminal of the $n^{th}$ switch in the N switches is connected to the $n^{th}$ finger in the second set of fingers.

4. The variable capacitor according to claim 1, wherein:
the first set of fingers comprises a first plurality of sequentially arranged fingers, each of the first set of fingers having a first equal length; and
the second set of fingers comprises a second plurality of sequentially arranged fingers, each of the second set of fingers having a second equal length.

5. The variable capacitor according to claim 1, wherein:
the first set of fingers comprises a first plurality of sequentially arranged fingers, each of the first set of fingers having an increasing or decreasing length in a sequence of arrangement; and
the second set of fingers comprises a second plurality of sequentially arranged fingers, each of the second set of fingers having an increasing or decreasing length in a sequence of arrangement.

6. The variable capacitor according to claim 5, wherein a length ratio of adjacent fingers in the first set of fingers is in a range of 1.02 times to 1.1 times, and a length ratio of adjacent fingers in the second set of fingers is in a range of 1.02 times to 1.1 times.

7. The variable capacitor according to claim 1, wherein the switch is a metal-oxide-semiconductor (MOS) switch.

8. The variable capacitor according to claim 1, wherein the switch is controlled to be turned off or on by a set of digital switch codewords.

9. A reflection-type phase shifter, comprising:
a positive input port, a positive output port, a negative input port, a negative output port, a first hybrid quadrature coupler, a second hybrid quadrature coupler, a first inductor, a second inductor, a third inductor, a fourth inductor, a first variable capacitor, and a second variable capacitor, wherein the first variable capacitor comprises:
a first comb structure and a first set of fingers, wherein the first comb structure comprises a first plurality of comb teeth, the first set of fingers comprises at least one first finger, the at least one first finger in the first set of fingers is disposed between at least two comb teeth of the first comb structure, and the at least one first finger in the first set of fingers has no electrical contact with the first plurality of comb teeth of the first comb structure;
a second comb structure and a second set of fingers, wherein the second comb structure comprises a second plurality of comb teeth, the second set of fingers comprises at least one second finger, the at least one second finger in the second set of fingers is disposed between at least two comb teeth of the second comb structure, and the at least one second finger in the second set of fingers has no electrical contact with the second plurality of comb teeth of the second comb structure; and
a first switch, configured to control whether there is electrical contact between the at least one first finger in the first set of fingers and the at least one second finger in the second set of fingers, wherein the first comb structure, the first set of fingers, the second comb structure, and the second set of fingers all comprise electrically conductive materials;
wherein the second variable capacitor comprises:
a third comb structure and a third set of fingers, wherein the third comb structure comprises a third plurality of comb teeth, the third set of fingers comprises at least one third finger, the at least one third finger in the third set of fingers is disposed between at least two comb teeth of the third comb structure, and the at least one third finger in the third set of fingers has no electrical contact with the third plurality of comb teeth of the third comb structure;
a fourth comb structure and a fourth set of fingers, wherein the fourth comb structure comprises a fourth plurality of comb teeth, the fourth set of fingers comprises at least one fourth finger, the at least one fourth finger in the fourth set of fingers is disposed between at least two comb teeth of the fourth comb structure, and the at least one fourth finger in the fourth set of fingers has no electrical contact with the fourth plurality of comb teeth of the fourth comb structure; and
a second switch, configured to control whether there is electrical contact between the at least one third finger in the first set of fingers and the at least one fourth finger in the fourth set of fingers, wherein the third comb structure, the third set of fingers, the fourth comb structure, and the fourth set of fingers all comprise electrically conductive materials;
wherein the positive input port is connected to an input port of the first hybrid quadrature coupler, the positive output port is connected to an isolated port of the first hybrid quadrature coupler, a coupled port of the first hybrid quadrature coupler is connected to a first connection terminal of the first variable capacitor via the first inductor, and a through port of the first hybrid quadrature coupler is connected to a first connection terminal of the second variable capacitor via the second inductor; and wherein the negative input port is connected to an input port of the second hybrid quadrature coupler, the negative output port is connected to an isolated port of the second hybrid quadrature coupler, a coupled port of the second hybrid quadrature coupler is connected to a second connection terminal of the first variable capacitor via the third inductor, and a through port of the second hybrid quadrature coupler is connected to a second connection terminal of the second variable capacitor via the fourth inductor.

10. The reflection-type phase shifter according to claim 9, wherein the first hybrid quadrature coupler and the second hybrid quadrature coupler each are a parallel-coupled microstrip line directional coupler, the first inductor is next to the third inductor, the second inductor is next to the fourth inductor, and the first variable capacitor and the second variable capacitor are between the first inductor and the second inductor and between the third inductor and the fourth inductor along routing directions of an input port and an output port of coupled lines of the first hybrid quadrature coupler and the second hybrid quadrature coupler.

11. A semiconductor device, comprising a variable capacitor, the variable capacitor comprising:
a first comb structure and a first set of fingers, wherein the first comb structure comprises a first plurality of comb teeth, the first set of fingers comprises at least one first finger, the at least one first finger in the first set of fingers is disposed between at least two comb teeth of the first comb structure, and the at least one first finger in the first set of fingers has no electrical contact with the first plurality of comb teeth of the first comb structure;
a second comb structure and a second set of fingers, wherein the second comb structure comprises a second plurality of comb teeth, the second set of fingers comprises at least one second finger, the at least one second finger in the second set of fingers is disposed between at least two comb teeth of the second comb structure, and the at least one second finger in the second set of fingers has no electrical contact with the second plurality of comb teeth of the second comb structure; and
a switch, configured to control whether there is electrical contact between the at least one first finger in the first set of fingers and the at least one second finger in the second set of fingers, wherein the first comb structure, the first set of fingers, the second comb structure, and the second set of fingers all comprise electrically conductive materials.

12. The semiconductor device according to claim 11, wherein:
the first comb structure and the second comb structure each comprise N+1 comb teeth, and the first set of fingers and the second set of fingers each comprise N fingers; and
for each integer value of n from 1 to N, an $n^{th}$ finger in the first set of fingers is located between an $n^{th}$ comb tooth and an $(n+1)^{th}$ comb tooth of the first comb structure, and an $n^{th}$ finger in the second set of fingers is located between an $n^{th}$ comb tooth and an $(n+1)^{th}$ comb tooth of the second comb structure, wherein n and N are both positive integers.

13. The semiconductor device according to claim 12, wherein N switches are connected between the first set of fingers and the second set of fingers, wherein a first terminal of an $n^{th}$ switch in the N switches is connected to the $n^{th}$ finger in the first set of fingers, and a second terminal of the $n^{th}$ switch in the N switches is connected to the $n^{th}$ finger in the second set of fingers.

14. The semiconductor device according to claim 11, wherein:
the first set of fingers comprises a first plurality of sequentially arranged fingers, each of the first set of fingers having a first equal length; and
the second set of fingers comprises a second plurality of sequentially arranged fingers, each of the second set of fingers having a second equal length.

15. The semiconductor device according to claim 11, wherein:
the first set of fingers comprises a first plurality of sequentially arranged fingers, each of the first set of fingers having an increasing or decreasing length in a sequence of arrangement; and
the second set of fingers comprises a second plurality of sequentially arranged fingers, each of the second set of fingers having an increasing or decreasing length in a sequence of arrangement.

16. The semiconductor device according to claim 15, wherein a length ratio of adjacent fingers in the first set of fingers is in a range of 1.02 times to 1.1 times, and a length ratio of adjacent fingers in the second set of fingers is in a range of 1.02 times to 1.1 times.

17. The semiconductor device according to claim 11, wherein the switch is a metal-oxide-semiconductor (MOS) switch.

18. The semiconductor device according to claim 11, wherein the switch is controlled to be turned off or on by a set of digital switch codewords.

* * * * *